(12) United States Patent
Kong

(10) Patent No.: US 11,222,280 B2
(45) Date of Patent: Jan. 11, 2022

(54) METHOD AND SYSTEM FOR GENERATING QUANTUM BIT CONTROL SIGNAL

(71) Applicant: ORIGIN QUANTUM COMPUTING COMPANY, LIMITED, HEFEI, Anhui (CN)

(72) Inventor: Weicheng Kong, Anhui (CN)

(73) Assignee: ORIGIN QUANTUM COMPUTING COMPANY, LIMITED, HEFEI, Anhui (CN)

( * ) Notice: Subject to any disclaimer, the term of this patent is extended or adjusted under 35 U.S.C. 154(b) by 270 days.

(21) Appl. No.: 16/624,038

(22) PCT Filed: May 9, 2019

(86) PCT No.: PCT/CN2019/086169
§ 371 (c)(1),
(2) Date: Dec. 18, 2019

(87) PCT Pub. No.: WO2020/155461
PCT Pub. Date: Aug. 6, 2020

(65) Prior Publication Data
US 2021/0182722 A1    Jun. 17, 2021

(30) Foreign Application Priority Data

Jan. 30, 2019 (CN) .......................... 201910093469.7
Jan. 30, 2019 (CN) .......................... 201910094220.8

(51) Int. Cl.
*G06F 3/00* (2006.01)
*G06N 10/00* (2019.01)
*G06F 9/54* (2006.01)

(52) U.S. Cl.
CPC ............... *G06N 10/00* (2019.01); *G06F 9/54* (2013.01)

(58) Field of Classification Search
CPC .................................. G06F 9/54; G06N 10/00
(Continued)

(56) References Cited

U.S. PATENT DOCUMENTS 8,111,083 B1 * 2/2012 Pesetski ................. H03K 17/92
326/3
10,325,218 B1 * 6/2019 Zeng ....................... G06N 10/00
(Continued)

FOREIGN PATENT DOCUMENTS

CN    1959708 A    5/2007
CN    105281886 A    1/2016
(Continued)

OTHER PUBLICATIONS

Cody Jones, Logical Qubit in a Linear Array of Semiconductor Quantum Dots. (Year: 2018).*
Foreign OA on CN201910094220.8, mail date Sep. 9, 2020 and Search result mail date June Aug. 30, 2020.

*Primary Examiner* — Lechi Truong
(74) *Attorney, Agent, or Firm* — IPro, PLLC

(57) ABSTRACT

The present disclosure provides a method and a system for generating a quantum bit control signal. The method includes: receiving a first tag code and a first standard signal corresponding to each basic quantum logic gate in a set of reference quantum gates from a master computer; storing the first standard signal, and obtaining a first address code identifying a storage location of the first standard signal; receiving a target tag code and a target time code corresponding to each basic quantum logic gate in a target quantum program from the master computer; and obtaining, according to the target tag code and the target time code, the first standard signal corresponding to the basic quantum logic gate in the target quantum program as a signal to be processed, and processing the signal to be processed to obtain the quantum bit control signal. The present disclosure (Continued)

may satisfy requirements of a multi-bit quantum bit test and provide quantum bit control signals required by the multi-bit quantum bit test, thereby greatly increasing a response speed of a control-signal generation module and ensuring a speed of subsequent quantum operations.

17 Claims, 3 Drawing Sheets

(58) Field of Classification Search
USPC .......................................................... 719/310
See application file for complete search history.

(56) References Cited

U.S. PATENT DOCUMENTS

| 2009/0015317 | A1 | 1/2009 | Divincenzo et al. | |
| 2018/0232652 | A1 | 8/2018 | Curtis et al. | |
| 2018/0260245 | A1* | 9/2018 | Smith ..................... | G06F 9/542 |

FOREIGN PATENT DOCUMENTS

| CN | 106301769 | A | 1/2017 |
| CN | 108154240 | A | 6/2018 |
| CN | 108780129 | A | 11/2018 |
| CN | 109165744 | A | 1/2019 |
| WO | 2017078735 | A1 | 5/2017 |

* cited by examiner

METHOD AND SYSTEM FOR GENERATING QUANTUM BIT CONTROL SIGNAL

CROSS-REFERENCE TO RELATED APPLICATION

The present application claims a priority to Chinese Patent Application No. 201910094220.8, titled "METHOD FOR GENERATING QUANTUM BIT CONTROL SIGNAL", and filed with the China National Intellectual Property Administration on Jan. 30, 2019, the disclosure of which is incorporated herein by reference.

The present application also claims a priority to Chinese Patent Application No. 201910093469.7, titled "SYSTEM FOR GENERATING QUANTUM BIT CONTROL SIGNAL", and filed with the China National Intellectual Property Administration on Jan. 30, 2019, the disclosure of which is incorporated herein by reference.

FIELD

The present disclosure relates to the field of signal processing technologies, and more particularly, to a method and a system for generating a quantum bit control signal.

BACKGROUND

A quantum chip is a core structure in a quantum computer, and a quantum bit is a basic computing unit in the quantum chip. When the quantum chip is running, it is necessary to provide reliable control signals to quantum bits of the quantum chip to achieve quantum chip tests and quantum computing. Acting on the quantum bit of the quantum chip, a quantum bit control signal may be capable of making a controllable specified change on a quantum state of a target quantum bit, so as to realize a quantum logic gate operation. In the actual computing process, a series of quantum logic gate operations need to be performed on the quantum bit, and thus the number and length of the quantum bit control signals will greatly increase due to the type and number of the quantum logic gate operations.

In the prior art, one method for generating a quantum bit control signal is to rely on a commercial signal source such as an arbitrary waveform generator. Generally, a control signal to be generated needs to be written in advance and temporarily stored in the arbitrary waveform generator, and then the arbitrary waveform generator is controlled by a control signal, so that the signal stored in advance is output to a DAC point by point for playback, and further, an analog waveform is obtained, thereby achieving an output of the quantum bit control signal.

The conventional system for generating a quantum bit control signal relies on the storage capacity of the arbitrary waveform generator. In regard of the quantum bit control signals required by multi-bit quantum bits, the conventional method for generating a quantum bit control signal has significant limitation as the method depends on the storage capacity of the arbitrary waveform generator, so requirements of a multi-bit quantum bit test cannot be met. Specifically, taking the quantum state tomography of a five-bit quantum bit in the quantum chip test as an example, a number of $(2^5)^2=1024$ projection measurement processes of the quantum bits need to be completed, and different processes requires for different quantum bit control signals. In order to ensure the operating efficiency of the system, all the quantum bit control signals need to be pre-designed and pre-stored in the storage capacity of the arbitrary waveform generator, which is a great challenge to the storage capacity of the arbitrary waveform generator, and is hard to be achieved.

SUMMARY

A first objective of the present disclosure is to provide a method for generating a quantum bit control signal, so as to overcome defects in the prior art. In addition to avoiding limitations in the conventional method for generating a quantum bit control signal, the method according to the present disclosure may satisfy requirements of a multi-bit quantum bit test and provide quantum bit control signals required by the multi-bit quantum bit test.

A second objective of the present disclosure is to provide a system for generating a quantum bit control signal.

To realize the above objectives, a method for generating a quantum bit control signal is provided according to a first embodiment of the present disclosure. The method for generating a quantum bit control signal includes:

receiving a first tag code and a first standard signal corresponding to each basic quantum logic gate in a set of reference quantum gates from a master computer, in which the set of reference quantum gates includes a plurality of basic quantum logic gates, the basic quantum logic gate includes a single-quantum logic gate and/or a double-quantum logic gate, the first tag code is configured to identify the basic quantum logic gate, the each basic quantum logic gate has the fixed first tag code, and the first standard signal is a signal that performs an operation of the basic quantum logic gate;

storing the first standard signal, and obtaining a first address code identifying a storage location of the first standard signal, in which the first address code and the first tag code are in a one-to-one correspondence;

receiving a target tag code and a target time code corresponding to each basic quantum logic gate in a target quantum program from the master computer, in which the target tag code is the first tag code corresponding to the basic quantum logic gate in the target quantum program, and the target time code is configured to identify an execution timing sequence of the basic quantum logic gate in the target quantum program;

obtaining, according to the target tag code and the target time code, the first standard signal corresponding to the basic quantum logic gate in the target quantum program as a signal to be processed; and processing the signal to be processed to generate the quantum bit control signal.

As the method described above for generating a quantum bit control signal, optionally, receiving the target tag code and the target time code corresponding to the each basic quantum logic gate in the target quantum program from the master computer includes:

decomposing the target quantum program to generate a combination of basic quantum logic gates;

obtaining the first tag code corresponding to the each basic quantum logic gate in the target quantum program, and recording the first tag code as the target tag code; and determining the target time code corresponding to the each basic quantum logic gate according to the execution timing sequence of the each basic quantum logic gate in the target quantum program.

As the method described above for generating a quantum bit control signal, optionally, obtaining, according to the target tag code and the target time code, the first standard signal corresponding to the basic quantum logic gate in the target quantum program as the signal to be processed includes:

setting a clock code and a clock triggering signal according to the target time code, in which the clock code and the clock triggering signal are in a one-to-one correspondence;

receiving the clock triggering signal;

obtaining the clock code corresponding to the clock triggering signal;

obtaining the target time code corresponding to the clock code;

obtaining the target tag code corresponding to the target time code;

obtaining the first address code corresponding to the target tag code; and obtaining the first standard signal stored corresponding to the first address code as the signal to be processed.

As the method described above for generating a quantum bit control signal, optionally, setting the clock code and the clock triggering signal according to the target time code includes:

determining the clock code according to the time code and a clock cycle, in which the clock code is equal to a ratio of the time code to the clock cycle, and the clock cycle is a clock cycle of a processing device; and forming the clock triggering signal according to the clock code.

As the method described above for generating a quantum bit control signal, optionally, processing the signal to be processed to obtain the quantum bit control signal includes:

performing a digital-to-analog conversion on the signal to be processed to obtain an analog quantum bit control signal.

As the method described above for generating a quantum bit control signal, optionally, before performing the digital-to-analog conversion on the signal to be processed to obtain the analog quantum bit control signal, the method further includes:

performing convolutional correction processing on the signal to be processed.

As the method described above for generating a quantum bit control signal, optionally, after storing the first standard signal and obtaining the first address code corresponding to the first tag code, the method further includes:

creating a convolver code corresponding to the first address code, in which the convolver code is corresponding to a preset convolver module, the preset convolver module is configured to perform convolutional correction processing on the first standard signal.

As the method described above for generating a quantum bit control signal, optionally, obtaining, according to the target tag code and the target time code, the first standard signal corresponding to the basic quantum logic gate in the target quantum program as the signal to be processed, and processing the signal to be processed to obtain the quantum bit control signal includes:

setting a clock code and a clock triggering signal according to the target time code, in which the clock code and the clock triggering signal are in a one-to-one correspondence;

receiving the clock triggering signal;

obtaining the clock code corresponding to the clock triggering signal;

obtaining the target time code corresponding to the clock code;

obtaining the target tag code corresponding to the target time code;

obtaining the first address code corresponding to the target tag code, and recording the first address code as an address code to be called;

obtaining the convolver code corresponding to the address code to be called, and recording the convolver code as a convolver code to be called;

loading the first standard signal corresponding to the address code to be called into the convolver module corresponding to the convolver code to be called, and performing, by the convolver module, the convolutional correction processing on the first standard signal loaded, so as to obtain a convolved signal; and performing digital-to-analog conversion processing on the convolved signal to generate the quantum bit control signal.

As the method described above for generating a quantum bit control signal, optionally, performing, by the convolver module, the convolutional correction processing on the first standard signal loaded, so as to obtain the convolved signal includes:

performing, by the convolver module, the convolutional correction processing on the first standard signal through an convolution function embedded, so as to obtain a signal with eliminating distortion.

As the method described above for generating a quantum bit control signal, optionally, before performing, by the convolver module, the convolutional processing on the first standard signal loaded, so as to obtain the signal with eliminating distortion, the method further includes:

adjusting the clock code corresponding to the convolver module according to an order of the convolution function.

Compared with the prior art, in the present disclosure, the set of reference quantum gates of the set of basic quantum logic gates that may realize an arbitrary quantum program by combinations is set in the master computer, and then the master computer sends the first tag code and the first standard signal corresponding to each of the basic quantum logic gates of the set of reference quantum gates to a set signal processing device, that is, the set signal processing device receives the first tag code and the first standard signal corresponding to the each of the basic quantum logic gates of the set of reference quantum gates sent by the master computer, stores the first standard signal, and obtains the first address code identifying the storage location of the first standard signal. After that, the target quantum program composed of basic quantum logic gates is set in the master computer, the target tag code and the target time code of each of the basic quantum logic gates in the target quantum program are recorded, and then the master computer sends the target tag code and the target time code of each of the basic quantum logic gates in the target quantum program to the set signal processing device. In this case, the set signal processing device only needs to obtain, according to the target tag code and the target time code, the first standard signal corresponding to the each basic quantum logic gate in the target quantum program as the signal to be processed, and then processes the signal to be processed to obtain the quantum bit control signal. Consequently, it may make full use of the storage capacity of the master device, and requirements on the storage capacity of the set signal processing device are greatly reduced. In addition, with the preset set of basic quantum logic gates (i.e., the set of reference quantum gates) that may realize an arbitrary quantum program by combinations, any target quantum program may be performed, quantum bit control signals required by the multi-bit quantum bit test may be provided, and requirements of the multi-bit quantum bit test may be satisfied.

To realize the above objectives, a system for generating a quantum bit control signal is provided according to a second embodiment of the present disclosure. The system for generating a quantum bit control signal includes a master computer, a main control module and a control-signal generation module.

The master computer is configured to obtain and to store a set of quantum logic gates and a target quantum program, to send a first tag code and a first standard signal corresponding to each basic quantum logic gate in the set of quantum logic gates to the main control module, and to send a target tag code and a target time code corresponding to each basic quantum logic gate in the target quantum program to the main control module, in which the set of quantum logic gates refers to a set including a plurality of quantum logic gates of quantum programs, the each basic quantum logic gate is corresponding to the unique first tag code, and the first standard signal is a signal for performing an operation of the basic quantum logic gate, the target tag code is the first tag code corresponding to the basic quantum logic gate in the target quantum program, and the target time code is configured to identify an execution timing sequence of the basic quantum logic gate in the target quantum program.

The main control module is configured to receive and to store the first tag code and the first standard signal, to set a first address code in a one-to-one correspondence with each first standard signal, to receive the target tag code and the target time code, and to generate a signal to be processed in combination with the first address code, the target tag code and the target time code.

The control-signal generation module is configured to receive and to process the signal to be processed, so as to generate the quantum bit control signal.

Furthermore, the master computer includes a first decomposition module, a first obtaining module and a first determination module.

The first decomposition module is configured to decompose the target quantum program to generate a combination of basic quantum logic gates.

The first obtaining module is configured to obtain the first tag code corresponding to the each basic quantum logic gate in the target quantum program, and to record the first tag code as the target tag code.

The first determination module is configured to determine the target time code corresponding to the each basic quantum logic gate according to the execution timing sequence of the each basic quantum logic gate in the target quantum program.

Furthermore, the main control module includes:
a second determination module, configured to determine a clock code according to the time code and a clock cycle, in which the clock code is equal to a ratio of the time code to the clock cycle, and the clock cycle is a clock cycle of a processing device;
a first processing module, configured to form a clock triggering signal according to the clock code;
a first receiving module, configured to receive the clock triggering signal;
a second obtaining module, configured to obtain the clock code corresponding to the clock triggering signal;
a third obtaining module, configured to obtain the target time code corresponding to the clock code;
a fourth obtaining module, configured to obtain the target tag code corresponding to the target time code;
a fifth obtaining module, configured to obtain the first address code corresponding to the target tag code; and
a second processing module, configured to obtain the first standard signal stored corresponding to the first address code as the signal to be processed.

Furthermore, the main control module includes a first creation module and a first convolution module.

The first creation module is configured to create a convolver code corresponding to the first address code, in which the convolver code is corresponding to a preset convolver module.

The first convolution module is configured to perform convolutional correction processing on the first standard signal.

Furthermore, the main control module further includes:
a first setting module, configured to set a clock code and a clock triggering signal according to the target time code, in which the clock code and the clock triggering signal are in a correspondence;
a second receiving module, configured to receive the clock triggering signal;
a sixth obtaining module, configured to obtain the clock code corresponding to the clock triggering signal;
a seventh obtaining module, configured to obtain the target time code corresponding to the clock code;
an eighth obtaining module, configured to obtain the target tag code corresponding to the target time code;
a ninth obtaining module, configured to obtain the first address code corresponding to the target tag code, and to record the first address code as an address code to be called;
a tenth obtaining module, configured to obtain the convolver code corresponding to the address code to be called, and to record the convolver code as a convolver code to be called;
a first loading module, configured to load the first standard signal corresponding to the address code to be called into the convolver module corresponding to the convolver code to be called, and to perform, by the convolver module, the convolutional correction processing on the first standard signal loaded, so as to obtain a convolved signal; and a second conversion module, configured to perform digital-to-analog conversion processing on the convolved signal to generate the quantum bit control signal.

Furthermore, the control-signal generation module includes:
a first conversion submodule, configured to perform a digital-to-analog conversion on the signal to be processed, so as to generate an analog quantum bit control signal.

Furthermore, the control-signal generation module further includes:
a second convolution submodule, configured to perform convolutional correction processing on the signal to be processed.

Compared with the prior art, the system for generating a quantum bit control signal controls the control-signal generation module to generate the quantum bit control signal according to the target tag code and the target time code issued by the master computer through the main control module. Since the control signal corresponding to the quantum logic gate is pre-stored in the main control module in the form of the first standard signal, and the signal to be processed is generated according to the target tag code, and the first address code stored in the main control module and corresponding to the first standard signal, requirements on the capacity storage of the main control module are greatly reduced at the source. In addition, the set of basic quantum logic gates that may realize any quantum program may be combined, and the quantum bit control signal is output to perform any target quantum program. Consequently, the present disclosure may provide the quantum bit control signal quickly, greatly increase the response speed of the control-signal generation module and ensure the speed of subsequent quantum operations.

BRIEF DESCRIPTION OF THE DRAWINGS

These and other aspects and advantages of embodiments of the present disclosure will become apparent and more readily appreciated from the following descriptions made with reference to the accompanying drawings.

DETAILED DESCRIPTION

The embodiments described below with reference to the accompanying drawings are exemplary, are merely used to explain the present disclosure, and cannot be construed as a limit to the present disclosure.

In quantum computing applications, depending on complexities of the computing applications, hundreds or even tens of thousands of computing procedures are required, but the number of basic computing operations used in all computing procedures is limited. For example, in classical computers, all computing applications may be implemented using combinations of two basic logic gate operations: NAND gate and XOR gate. In quantum computers, all quantum computing applications may be implemented using combinations of single-quantum logic gate operations and double-quantum logic gate operations. For example, in a two-bit quantum chip, all quantum computing applications may be realized by using a quantum logic gate operation combination: $\{X_{\pi/2}^1, X_{\pi/2}^2, Y_{\pi/2}^2, Z_{\pi/8}^1, Z_{\pi/8}^2, CZ_{12}\}$; in a three-bit quantum chip, all quantum computing applications may be implemented using a quantum logic gate operation combination: $\{X_{\pi/2}^1, X_{\pi/2}^2, X_{\pi/2}^3, Y_{\pi/2}^1, Y_{\pi/2}^2, Y_{\pi/2}^3, Z_{\pi/8}^1, Z_{\pi/8}^2, Z_{\pi/8}^3, CZ_{12}, CZ_{23}\}$; in a four-bit quantum chip, all quantum operation applications may be implemented using a quantum logic gate operation combination: $\{X_{\pi/2}^1, X_{\pi/2}^2, X_{\pi/2}^3, X_{\pi/2}^4, Y_{\pi/2}^1, Y_{\pi/2}^2, Y_{\pi/2}^3, Y_{\pi/2}^4, Z_{\pi/8}^1, Z_{\pi/8}^2, Z_{\pi/8}^3, Z_{\pi/8}^4, CZ_{12}, CZ_{23}, CZ_{34}\}$; and in a five-bit quantum chip, all quantum computing applications may be implemented using a quantum logic gate operation combination: $\{X_{\pi/2}^1, X_{\pi/2}^2, X_{\pi/2}^3, X_{\pi/2}^4, X_{\pi/2}^5, Y_{\pi/2}^1, Y_{\pi/2}^2, Y_{\pi/2}^3, Y_{\pi/2}^4, Y_{\pi/2}^5, Z_{\pi/8}^1, Z_{\pi/8}^2, Z_{\pi/8}^3, Z_{\pi/8}^4, Z_{\pi/8}^5, CZ_{12}, CZ_{23}, CZ_{34}, CZ_{45}\}$ and so on.

Embodiment 1

Figure 1:
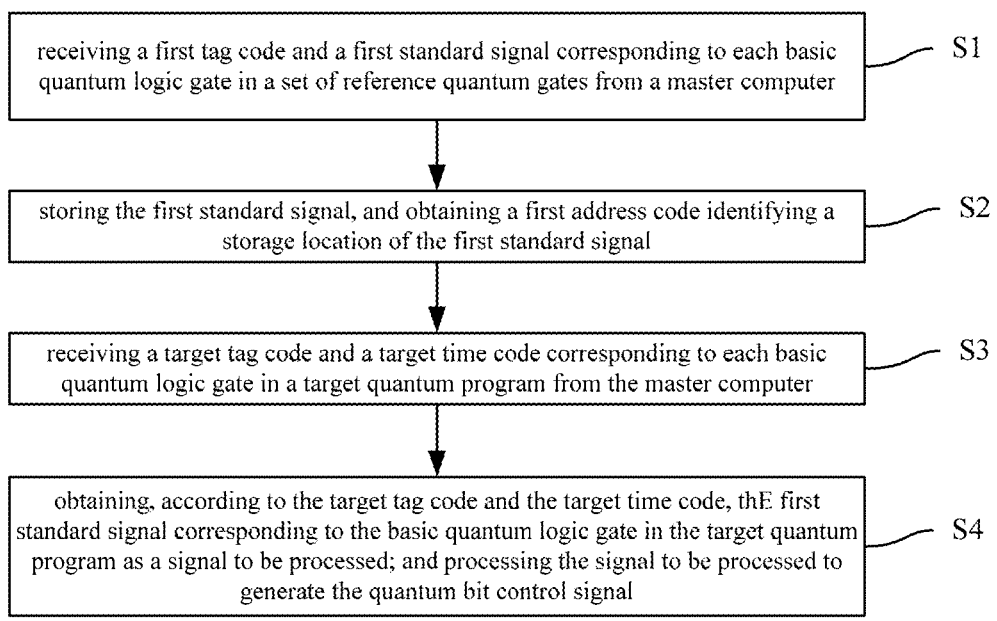
FIG. 1 is a flowchart of a method for generating a quantum bit control signal according to embodiment 1 of the present disclosure.

FIG. 1 is a flowchart of a method for generating a quantum bit control signal according to embodiment 1 of the present disclosure. As illustrated in FIG. 1, the present embodiment provides a method for generating a quantum bit control signal that transforms a quantum computing application into a basic quantum bit control signal, and finally sends the basic quantum bit control signal to a quantum chip to perform computing. It should be noted that the basic quantum bit control signal described here is not a control signal for completing the entire computing application of the quantum chip, but a basic signal for completing a computing procedure (that is, a target quantum program).

The method for generating the quantum bit control signal includes the followings.

At block S1, a first tag code and a first standard signal corresponding to each basic quantum logic gate in a set of reference quantum gates from a master computer are received, in which the set of reference quantum gates includes a plurality of basic quantum logic gates, the basic quantum logic gate include a single-quantum logic gate and/or a double-quantum logic gate, the first tag code is configured to identify the basic quantum logic gate, the each basic quantum logic gate has the fixed first tag code, and the first standard signal is a signal that performs an operation of the basic quantum logic gate.

In detail, for the two-bit quantum chip, the set of reference quantum gates is:

$\{X_{\pi/2}^1, X_{\pi/2}^2, Y_{\pi/2}^2, Z_{\pi/8}^1, Z_{\pi/8}^2, CZ_{12}\}$;

for the three-bit quantum chip, the set of quantum logic gates is:

$\{X_{\pi/2}^1, X_{\pi/2}^2, X_{\pi/2}^3, Y_{\pi/2}^1, Y_{\pi/2}^2, Y_{\pi/2}^3, Z_{\pi/8}^1, Z_{\pi/8}^2, Z_{\pi/8}^3, CZ_{12}, CZ_{23}\}$, and for the four-bit quantum chip, the set of quantum logic gates is:

$\{X_{\pi/2}^1, X_{\pi/2}^2, X_{\pi/2}^3, X_{\pi/2}^4, Y_{\pi/2}^1, Y_{\pi/2}^2, Y_{\pi/2}^3, Y_{\pi/2}^4, Z_{\pi/8}^1, Z_{\pi/8}^2, Z_{\pi/8}^3, Z_{\pi/8}^4, CZ_{12}, CZ_{23}, CZ_{34}\}$.

Specifically, X-gates, Y-gates and Z-gates are single-qubit logic gates, and CZ-gates are double-qubit logic gates. The number in the upper right corner of a single-qubit logic gate indicates a quantum bit label on the quantum chip, and the angle in the lower right corner of the single-qubit logic gate indicates an angle of a logic-state change of the quantum bit caused by the operation of the single-qubit logic gate. The number in the lower right corner of a double-qubit logic gate indicates a master quantum bit and a controlled quantum bit. Single-qubit logic gates, X-gates, Y-gates as well as Z-gates, and the double-qubit logic gates CZ-gates may be combined to realize arbitrary quantum logic gates. Therefore, any complex quantum logic gate may be decomposed into a combination of the single-qubit logic gate and the double-qubit logic gate. In the embodiment of the present disclosure, the single-qubit logic gates, X-gates, Y-gates as well as Z-gates, and the double-qubit logic gates CZ-gates are referred to basic quantum logic gates.

A corresponding first tag code is set for any basic quantum logic gate in the set of reference quantum gates. The first tag code is configured to identify the basic quantum logic gate. One basic quantum logic gate has one fixed first tag code. A corresponding first standard signal is set for any basic quantum logic gate in the set of reference quantum gates, and the first standard signal is a signal for implementing an operation of the corresponding basic quantum logic gate.

The master computer is responsible for sending a set of reference quantum gates to a set signal processing device in a format of "first tag code+first standard signal", that is, the set signal processing device receives the first tag code and the first standard signal corresponding to each of the basic quantum logic gates in the set of reference quantum gates, sent by the master computer.

It should be noted that the set signal processing device may be a FPGA chip.

At block S2, the first standard signal is stored, and a first address code identifying a storage location of the first standard signal is obtained, in which the first address code and the first tag code are in a one-to-one correspondence.

In detail, the set signal processing device stores the first standard signal, and obtains the first address code identifying the storage location of the first standard signal. The set signal processing device is the FPGA chip. The FPGA chip may be divided into a control module and a storage module by functions. The control module communicates with the master computer, receives information in the format of "first tag code+first standard signal" sent by the master computer, and controls the first standard signal to be stored in the storage module. The storage module may be a cache DDR3 or DDR4. The storage module stores the first standard signal and returns a storage address to the control module. For example, the storage module may directly return an address (that is, the address code) of the first binary number that stores the first standard signal to the control module. After using the address code, the control module may load the first standard signal corresponding to the address code in a cache module (that is, the storage module) for subsequent use.

At block S3, a target tag code and a target time code corresponding to each basic quantum logic gate in a target quantum program from the master computer are received, in which the target tag code is the first tag code corresponding to the basic quantum logic gate in the target quantum program, and the target time code is configured to identify an execution timing sequence of the basic quantum logic gate in the target quantum program.

In detail, the target quantum program is a quantum computing application to be run, and is implemented by one or a combination of the single-quantum logic gate, the double-quantum logic gate and the multi-quantum logic gate. Any multi-quantum logic gate may be decomposed into a combination of the single-quantum logic gate and the double-quantum logic gate. Therefore, the target quantum program may be decomposed into a combination of basic quantum logic gates. One basic quantum logic gate has one fixed first tag code, and at the same time, a position of each basic quantum logic gate appears in the target quantum program represents an execution timing sequence of each basic quantum logic gate. Specifically, the time code is converted from the precise execution time of the corresponding operation procedure in the quantum computing application (that is, the target quantum program). For example, the time code of the computing procedure executed 40 ns after the start of the computing may be written as 40.

Accordingly, the target quantum program may be converted into an instruction expressed by the first tag code and the time code. Specifically, the first tag code corresponding to the each basic quantum logic gate in the target quantum program is obtained, and the first tag code is recorded as the target tag code; and the target time code corresponding to the each basic quantum logic gate is determined according to the execution timing sequence of the each basic quantum logic gate in the target quantum program.

The master computer is responsible for sending the target quantum program to the set signal processing device in a format of "target tag code+target address code", that is, the set signal processing device receives the target tag code and the target time code corresponding to each of the basic quantum logic gates in the target quantum program, sent by the master computer.

In detail, when the set signal processing device is the FPGA chip and the FPGA chip may be divided into the control module and the storage module by function, the set signal processing device receives the target tag code and the target time code corresponding to each of the basic quantum logic gates in the target quantum program sent by the master computer, that is, the control module receives the target tag code and the target time code corresponding to each of the basic quantum logic gates in the target quantum program sent by the master computer.

At block S4, the first standard signal corresponding to the basic quantum logic gate in the target quantum program is obtained, according to the target tag code and the target time code, as a signal to be processed; and the signal to be processed is processed to generate the quantum bit control signal.

In detail, since the control module stores the first tag code and the first address code that are in a one-to-one correspondence, when the control module receives the target tag code and the target time code again, the control module may, with the help of the tag codes (the target tag code and the first tag code), quickly find the first address code corresponding to the target time code, call the first standard signal stored at the position of the first address code as the signal to be processed, and then process the signal to be processed to generate the quantum bit control signal.

In the whole process, according to the distribution of quantum bits in a quantum chip to be measured, the set of reference quantum gates is set, and the first tag code and the first standard signal in a one-to-one correspondence with each of the basic quantum logic gates in the set of reference quantum gates are set. The first tag code and the first standard signal are stored in the set signal processing device for later use. When setting the set of reference quantum gates, it is necessary to ensure that the basic quantum logic gates in the set of reference quantum gates may realize any quantum program through combinations, that is, in essence, the basic quantum logic gates in the set of reference quantum gates may realize any complex quantum logic gate through combinations, which provides a reference and basis for later calls. For the target tag code and the target time code sent by the master computer and representing the basic quantum logic gate in the target quantum program, the signal processing device quickly finds the first address code corresponding to the target time code with the help of the tag codes (the target tag code and the first tag code), calls the first standard signal stored at the position of the first address code as the signal to be processed, and then processes the signal to be processed to obtain the quantum bit control signal. Consequently, it makes full use of the storage capacity of the master computer, and requirements on the storage capacity of the set signal processing device are greatly reduced. In addition, with the preset set of basic quantum logic gates (i.e., the set of reference quantum gates) that may perform an arbitrary quantum program by combinations, any target quantum program may be performed accurately, quantum bit control signals required by the multi-bit quantum bit test may be provided, and requirements of the multi-bit quantum bit test may be satisfied.

As a specific implementation of this embodiment, the procedure that the first standard signal corresponding to the basic quantum logic gate in the target quantum program is obtained, according to the target tag code and the target time code, as the signal to be processed described at block S4 includes the followings.

At block S41, a clock code and a clock triggering signal are set according to the target time code, in which the clock code and the clock triggering signal are in a one-to-one correspondence.

At block S42, the clock triggering signal is received.

At block S43, the clock code corresponding to the clock triggering signal is obtained.

At block S44, the target time code corresponding to the clock code is obtained.

At block S45, the target tag code corresponding to the target time code is obtained.

At block S46, the first address code corresponding to the target tag code is obtained.

At block S47, the first standard signal stored corresponding to the first address code is obtained as the signal to be processed.

Blocks S41 to S47 describe the process of obtaining the signal to be processed according to the target tag code and the target time code. At blocks S41 to S47, not only an object to be processed (i.e., the signal to be processed) is considered, but also the executing time for the signal to be processed is considered, that is, the clock triggering signal finally determined by the time code and the clock code is used as the basic for triggering the signal to be processed.

In a specific implementation, a clock management module is set in the FPGA chip, and the clock triggering signal of the clock management module is set according to the clock code. The clock code is set according to the time code, and may be specifically described as the ratio of the time code to the clock cycle, in which the clock cycle is a clock cycle of the set signal processing device. For example, supposing that a basic clock frequency is 200 MHz and a clock cycle is 5 ns for a chip XilinxV7FPGA, a conversion relationship between the time code and the clock code is that: clock code=time code/5. It should be noted that the clock code must be an integer, and such a condition may be ensured from the design of the quantum computing application (that is, the target quantum program).

At the same time, the digital-to-analog conversion is performed on the signal to be processed to obtain the analog quantum bit control signal at block S4. In detail, a high-speed digital-to-analog conversion is performed on the signal to be processed to obtain the analog quantum bit control signal. The high-speed digital-to-analog conversion may be implemented by a high-speed DAC chip. In specific settings, a sampling rate of the DAC chip may be selected according to a speed of loading the first standard signal from the storage module. In addition, in order to ensure high-speed signal generation, several parallel storage modules may be provided to ensure the processing efficiency of the first standard signal.

In addition, before performing the digital-to-analog conversion on the signal, preferably, convolutional correction processing may be performed on the signal to be processed to compensate for a signal distortion caused by a circuit defect.

Embodiment 2

With regard to the convolutional correction processing on the signal to be processed, the present disclosure provides a specific implementation of the method for generating the quantum bit control signal according to embodiment 1. Differing from embodiment 1, this embodiment explicitly describes preparation work and specific processes of performing the convolutional correction processing on the signal to be processed.

In detail, after storing the first standard signal and obtaining the first address code corresponding to the first tag code, the method for generating the quantum bit control signal further includes: creating a convolver code corresponding to the first address code, in which the convolver code is corresponding to a preset convolver module, and the preset convolver module is configured to perform convolutional correction processing on the first standard signal.

That is, the convolver code and the convolver module corresponding to each other are created inside the control module. The number of the convolver codes and the convolver modules is consistent with the number of the first standard signals stored. The convolver module is a module that embeds a convolution function, and the specific form of the convolution function may be set as required. In this embodiment, when the convolutional processing is performed on discrete digital signals to be processed, an order of the convolution function determines the time of the convolutional processing.

After the convolver code and the convolver module are set, the procedure that the first standard signal corresponding to the basic quantum logic gate in the target quantum program is obtained, according to the target tag code and the target time code, as the signal to be processed, and that the signal to be processed is processed to obtain the quantum bit control signal described at block S4 include the followings.

At block S51, the clock code and the clock triggering signal are set according to the target time code, in which the clock code and the clock triggering signal are in a one-to-one correspondence.

At block S52, the clock triggering signal is received.

At block S53, the clock code corresponding to the clock triggering signal is obtained; the target time code corresponding to the clock code is obtained; and the target tag code corresponding to the target time code is obtained.

At block S54, the first address code corresponding to the target tag code is obtained, and the first address code is recorded as an address code to be called.

At block S55, the convolver code corresponding to the address code to be called is obtained, and the convolver code is recorded as a convolver code to be called.

At block S56, the first standard signal corresponding to the address code to be called is loaded into the convolver module corresponding to the convolver code to be called, and the convolver module performs the convolutional correction processing on the first standard signal loaded, so as to obtain a convolved signal.

At block S57, digital-to-analog conversion processing is performed on the convolved signal to generate the quantum bit control signal.

Blocks S51 to S57 realize the process of generating corresponding quantum bit control signals according to an execution sequence of the quantum logic gates in the target quantum program. In this process, the convolver module is controlled by the clock triggering signal, which corresponds to the execution timing sequence of the basic quantum logic gates in the target quantum program, so that the effectiveness of implementing the quantum bit control signal is improved.

In specific implementation, in order to avoid a time delay in processing of different convolution processing modules and digital-to-analog conversion modules, a compensation for the clock code may be performed in advance according to the order of the convolution function in the convolution processing module, so as to correct a time difference in operating a signal generated by the digital-to-analog conversion modules. For example, when the maximum order of the convolution functions in all convolution processing modules is 10, it takes 10 clock cycles to perform convolutional corrections in the convolution processing modules, so a clock-code compensation value of the convolution processing modules is set to 10−N, where N is the order of the convolution function in the convolution processing modules. In this manner, instead of processing the corresponding first standard signal at the time of the clock code, the convolution processing module will process the corresponding first standard signal at the time of: clock code+10−N.

It should be noted that when the master computer executes translation of the quantum computing application, that is, when the master computer analyzes the quantum program, it is possible that different computing procedures (operations of the quantum logic gate) may be performed on different quantum bits simultaneously. In other words, there may be a case where the first tag codes of different first standard signals correspond to the same first time code. However, given that there are multiple parallel convolution processing modules in the FPGA, each first standard signal corresponds to only one convolution processing module, and two identical first standard signals cannot exist at the same time, the method of converting the first tag code in the set of reference quantum gates of the master computer into a combination of the first tag code, the first address code and the first convolver code in an instruction demodulation module, and of sending the first tag code, the first address code and the first convolver code, respectively, into the parallel convolution processing modules for processing and computing will not cause conflicts. At the same time, by providing corrections to the quantum bit control signals, convolution processing may effectively reduce a system error rate of the quantum chip in performing quantum computing applications.

In summary, the method for generating the quantum bit control signal according to the present disclosure may automatically convert any quantum computing application (that is, the target quantum program) into the quantum bit control signal and send the quantum bit control signal to the quantum chip to complete a test or a computing process.

For example, in the five-bit quantum chip, all quantum computing applications may be implemented using the following set of reference quantum gates: $\{X_{\pi/2}^1, X_{\pi/2}^2, X_{\pi/2}^3, X_{\pi/2}^4, X_{\pi/2}^5, Y_{\pi/2}^1, Y_{\pi/2}^2, Y_{\pi/2}^3, Y_{\pi/2}^4, Y_{\pi/2}^5, Z_{\pi/8}^1, Z_{\pi/8}^2, Z_{\pi/8}^3, Z_{\pi/8}^4, Z_{\pi/8}^5, CZ_{12}, CZ_{23}, CZ_{34}, CZ_{45}\}$.

Normally, an average operation time of each basic quantum logic gate is 50 ns. Therefore, in the set of reference quantum gates, the total playable capacity occupied by the first standard signals is only 19×50 ns=950 ns. At the same time, there is no upper limit to the number of quantum computing applications that may be generated using the 19 first standard signals. Therefore, the present disclosure may greatly alleviate the shortage of hardware resources in the field of quantum computing.

Figure 2:
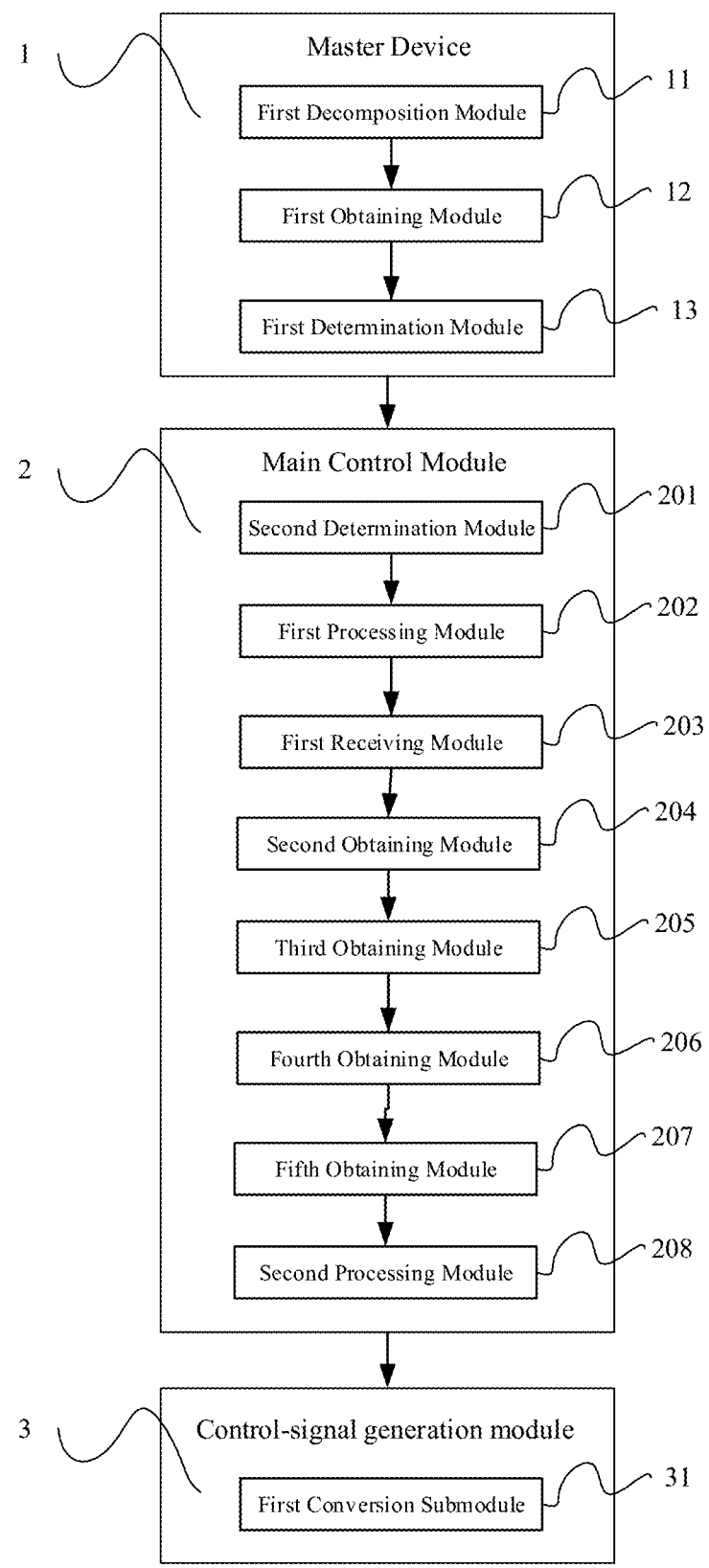
FIG. 2 is a block diagram of a hardware structure of a system for generating a quantum bit control signal according to embodiment 3 of the present disclosure.

With reference to FIG. 2, this embodiment provides a system for generating a quantum bit control signal. The system includes a master computer 1, a main control module 2 and a control-signal generation module 3.

The master computer 1 is configured to obtain and to store the set of quantum logic gates and the target quantum program.

In detail, the set of quantum logic gates refers to the set including a plurality of quantum logic gates of quantum programs, the each basic quantum logic gate is corresponding to the unique first tag code, and the first standard signal is a signal for performing an operation of the basic quantum logic gate.

The target quantum program refers to a quantum program that may be implemented by a combination of the basic quantum logic gates in the set of quantum logic gates. The target tag code is the first tag code of the basic quantum logic gate in the target quantum program. The target time code is the execution timing sequence of the basic quantum logic gate in the target quantum program.

The master computer 1 is configured to send the first tag code and the first standard signal corresponding to each basic quantum logic gate in the set of quantum logic gates, as well as the target tag code and the target time code corresponding to each basic quantum logic gate in the target quantum program to the main control module 2.

The main control module 2 is configured to receive and to store the first tag code and the first standard signal, to set the first address code in a one-to-one correspondence with each first standard signal, to receive the target tag code and the target time code, and to generate the signal to be processed through calling the first standard signal in combination with the first address code, the target tag code and the target time code.

The control-signal generation module 3 is configured to receive and to process the signal to be processed, so as to generate the quantum bit control signal.

Compared with the prior art, the system for generating a quantum bit control signal controls the control-signal generation module to generate the quantum bit control signal according to the target tag code and the target time code issued by the master computer through the main control module. Since the control signal corresponding to the quantum logic gate is pre-stored in the main control module in the form of the first standard signal, and the signal to be processed is generated according to the target tag code, and the first address code stored in the main control module and corresponding to the first standard signal, requirements on the capacity storage of the main control module for implementing any target quantum program are greatly reduced at the source.

According to the embodiment, the set of basic quantum logic gates that may realize any quantum program may be combined, and the quantum bit control signal required when executing any target quantum program may be output, thereby greatly increasing the response speed of the control-signal generation module and ensuring the speed of subsequent quantum operations.

Embodiment 3

With reference to FIG. 2, this embodiment provides the system for generating the quantum bit control signal. The system includes the master computer 1, the main control module 2 and the control-signal generation module 3.

The master computer 1 stores the set of quantum logic gates and the target quantum program.

In detail, the set of quantum logic gates refers to a set that includes a plurality of basic quantum logic gates, the each basic quantum logic gate corresponds to the unique first tag code, and the first standard signal is a signal for performing an operation of the basic quantum logic gate.

The target quantum program refers to a quantum program that may be implemented by a combination of the basic quantum logic gates in the set of quantum logic gates. The first tag code of the basic quantum logic gate in the target quantum program is recorded as the target tag code, and the execution timing sequence of the basic quantum logic gate in the target quantum program is recorded as the target time code.

The master computer 1 is configured to send the first tag code and the first standard signal corresponding to each basic quantum logic gate in the set of quantum logic gates, as well as the target tag code and the target time code corresponding to each basic quantum logic gate in the target quantum program to the main control module 2.

The set of quantum logic gates refers to a set of basic quantum logic gates that may realize any target quantum program through combinations, and the setting of the set of quantum logic gates may be specifically described as follows.

For the two-bit quantum chip, the set of quantum logic gates is:
$\{X_{\pi/2}^1, X_{\pi/2}^2, Y_{\pi/2}^2, Z_{\pi/8}^1, Z_{\pi/8}^2, CZ_{12}\}$;

for the three-bit quantum chip, the set of quantum logic gates is:
$\{X_{\pi/2}^1, X_{\pi/2}^2, X_{\pi/2}^3, Y_{\pi/2}^1, Y_{\pi/2}^2, Y_{\pi/2}^3, Z_{\pi/8}^1, Z_{\pi/8}^2, Z_{\pi/8}^3, CZ_{12}, CZ_{23}\}$, and for the four-bit quantum chip, the set of quantum logic gates is:
$\{X_{\pi/2}^1, X_{\pi/2}^2, X_{\pi/2}^3, X_{\pi/2}^4, Y_{\pi/2}^1, Y_{\pi/2}^2, Y_{\pi/2}^3, Y_{\pi/2}^4, Z_{\pi/8}^1, Z_{\pi/8}^2, Z_{\pi/8}^3, Z_{\pi/8}^4, CZ_{12}, CZ_{23}, CZ_{34}\}$.

Specifically, X-gates, Y-gates and Z-gates are single-qubit logic gates, and CZ-gates are double-qubit logic gates. The number in the upper right corner of a single-qubit logic gate indicates a quantum bit label on the quantum chip, and the angle in the lower right corner of the single-qubit logic gate indicates an angle of a logic-state change of the quantum bit caused by the operation of the single-qubit logic gate. The number in the lower right corner of a double-qubit logic gate indicates a master quantum bit and a controlled quantum bit. Single-qubit logic gates, X-gates, Y-gates as well as Z-gates, and the double-qubit logic gates CZ-gates are basic quantum logic gates, which may be combined to realize any quantum logic gate. Therefore, any complex quantum logic gate may be decomposed into a combination of the single-qubit logic gate and the double-qubit logic gate. In the embodiment of the present disclosure, the single-qubit logic gates, X-gates, Y-gates as well as Z-gates, and the double-qubit logic gates CZ-gates are referred to basic quantum logic gates.

A corresponding first tag code is set for any basic quantum logic gate in the set of quantum logic gates. The first label code is configured to identify the basic quantum logic gate. One basic quantum logic gate has one fixed first tag code. A corresponding first standard signal is set for any basic quantum logic gate in the set of quantum logic gates, and the first standard signal is a signal for implementing an operation of the corresponding basic quantum logic gate.

The master computer 1 is responsible for sending the set of quantum logic gates to the set main control module 2 in the form of "first tag code+first standard signal".

Further, the master computer 1 is also responsible for sending the target tag code and the target time code corresponding to each basic quantum logic gate of the target quantum program to the main control module 2. Correspondingly, the master computer 1 is also internally provided with a first decomposition module 11, a first obtaining module 12 and a first determination module 13.

The first decomposition module 11 is configured to decompose the target quantum program to generate a combination of basic quantum logic gates.

The first obtaining module 12 is configured to obtain the first tag code corresponding to the each basic quantum logic gate in the target quantum program, and to record the first tag code as the target tag code.

The first determination module 13 is configured to determine the target time code corresponding to the each basic quantum logic gate according to the execution timing sequence of the each basic quantum logic gate in the target quantum program.

In detail, the target quantum program is a quantum computing application to be run, and is implemented by one or a combination of the single-quantum logic gate, the double-quantum logic gate and the multi-quantum logic gate. Any multi-quantum logic gate may be decomposed into a combination of the single-quantum logic gate and the double-quantum logic gate. Therefore, the target quantum program may be decomposed into a combination of basic quantum logic gates. One basic quantum logic gate has one fixed first tag code, and at the same time, a position of each basic quantum logic gate appears in the target quantum program represents an execution timing sequence of each basic quantum logic gate. Specifically, the time code is converted from the precise execution time of the corresponding operation procedure in the quantum computing application. For example, the time code of the computing procedure executed 40 ns after the start of the computing may be written as 40.

Accordingly, the target quantum program may be converted into an instruction expressed by the first tag code and the time code. Specifically, the first decomposition module 11 decomposes the target quantum program into a combination of the basic quantum logic gates; the first obtaining module 12 obtains the first tag code corresponding to the each basic quantum logic gate in the target quantum program, and records the first tag code as the target tag code; and the first determination module 13 determines the target time code corresponding to the each basic quantum logic gate according to the execution timing sequence of the each basic quantum logic gate in the target quantum program.

The main control module 2 includes: a second determination module 201, a first processing module 202, a first receiving module 203, a second obtaining module 204, a third obtaining module 205, a fourth obtaining module 206, a fifth obtaining module 207 and a second processing module 208.

The second determination module 201 is configured to determine the clock code according to the time code and the clock cycle, in which the clock code is equal to the ratio of the time code to the clock cycle, and the clock cycle is a clock cycle of a processing device.

The first processing module 202 is configured to form the clock triggering signal according to the clock code.

The first receiving module 203 is configured to receive the clock triggering signal.

The second obtaining module 204 is configured to obtain the clock code corresponding to the clock triggering signal.

The third obtaining module 205 is configured to obtain the target time code corresponding to the clock code.

The fourth obtaining module 206 is configured to obtain the target tag code corresponding to the target time code.

The fifth obtaining module 207 is configured to obtain the first address code corresponding to the target tag code.

The second processing module 208 is configured to obtain the first standard signal stored corresponding to the first address code as the signal to be processed.

The above modules may obtain the signal to be processed according to the target tag code and the target time code. With the above modules, not only the object to be processed (i.e., the signal to be processed) is considered, but also the executing time for the signal to be processed is considered, that is, the clock triggering signal finally determined by the time code and the clock code is used as the basic for triggering the signal to be processed.

In detail, the above modules may be integrated by the clock management module. The clock triggering signal of the clock management module is set according to the clock code. The clock code is set according to the time code, and may be specifically described as the ratio of the time code to the clock cycle, in which the clock cycle is a clock cycle of the set signal processing device. For example, supposing that the basic clock frequency is 200 MHz and the clock cycle is 5 ns for the chip XilinxV7FPGA, the conversion relationship between the time code and the clock code is that: clock code=time code/5. It should be noted that the clock code must be an integer, and such a condition may be ensured from the design of the quantum computing application (that is, the target quantum program).

The control-signal generation module 3 includes a first conversion submodule 31. The first conversion submodule 31 is configured to perform the digital-to-analog conversion on the signal to be processed, so as to generate the analog quantum bit control signal. In detail, the high-speed digital-to-analog conversion is performed on the signal to be processed to obtain the analog quantum bit control signal. The high-speed digital-to-analog conversion may be implemented by the high-speed DAC chip. In specific settings, the sampling rate of the DAC chip may be selected according to the speed of loading the first standard signal from the storage module. In addition, in order to ensure high-speed signal generation, several parallel storage modules may be provided to ensure the processing efficiency of the first standard signal.

The method for generating the quantum bit control signal through modules for generating the quantum bit control signal according to embodiment 3 includes the following blocks.

At block S201, the master computer 1 sends the first tag code and the first standard signal corresponding to the each basic quantum logic gate in the set of quantum logic gates to the main control module 2; in which, the set of quantum logic gates refers to a set of basic quantum logic gates that may realize any quantum program by combinations, the basic quantum logic gate includes the single-quantum logic gate and/or the double-quantum logic gate, the first tag code is configured to identify the basic quantum logic gate, the each basic quantum logic gate has the fixed first tag code, and the first standard signal is a signal that performs an operation of the basic quantum logic gate.

At block S202, the main control module 2 stores the first standard signal, and obtains the first address code identifying the storage location of the first standard signal, in which the first address code and the first tag code are in a one-to-one correspondence.

In detail, the main control module 2 stores the first standard signal, and obtains the first address code identifying the storage location of the first standard signal. Specifically, the main control module 2 adopts the FPGA chip and the storage module. The main control module 2 communicates with the master computer 1, receives information in the format of "first tag code+first standard signal" sent by the master computer 1, and controls the first standard signal to be stored in the storage module. The storage module may be the cache DDR3 or DDR4. The storage module stores the first standard signal and returns the storage address to the control module. For example, the storage module may directly return the address (that is, the address code) of the first binary number that stores the first standard signal to the control module. After using the address code, the control module may load the first standard signal corresponding to the address code in the cache module (that is, the storage module) for subsequent use.

At block S203, the main control module 2 receives the target tag code and the target time code corresponding to the each basic quantum logic gate in the target quantum program, sent by the master computer 1, in which the target tag code is the first tag code corresponding to the basic quantum logic gate, and the target time code is configured to identify the execution timing sequence of the basic quantum logic gate in the target quantum program.

In detail, the target quantum program is the quantum computing application to be run, and is implemented by one or a combination of the single-quantum logic gate, the double-quantum logic gate and the multi-quantum logic gate. Any multi-quantum logic gate may be decomposed into a combination of the single-quantum logic gate and the double-quantum logic gate. Therefore, the target quantum program may be decomposed into a combination of basic quantum logic gates. One basic quantum logic gate has one fixed first tag code, and at the same time, the position of each basic quantum logic gate appears in the target quantum program represents the execution timing sequence of each basic quantum logic gate. Specifically, the time code is converted from the precise execution time of the corresponding operation procedure in the quantum computing application (that is, the target quantum program). For example, the time code of the computing procedure executed 40 ns after the start of the computing may be written as 40.

Accordingly, the target quantum program may be converted into an instruction expressed by the first tag code and the time code. Specifically, the first tag code corresponding to the each basic quantum logic gate in the target quantum program is obtained, and the first tag code is recorded as the target tag code; and the target time code corresponding to the each basic quantum logic gate is determined according to the execution timing sequence of the each basic quantum logic gate in the target quantum program.

The master computer is responsible for sending the target quantum program to the set signal processing device in the format of "target tag code+target address code", that is, the set signal processing device receives the target tag code and the target time code corresponding to each of the basic quantum logic gates in the target quantum program sent by the master computer.

In detail, when the set signal processing device is the FPGA chip and the FPGA chip may be divided into the control module and the storage module by function, the set signal processing device receives the target tag code and the target time code corresponding to each of the basic quantum logic gates in the target quantum program sent by the master computer, that is, the control module receives the target tag code and the target time code corresponding to each of the basic quantum logic gates in the target quantum program sent by the master computer.

At block S204, the control-signal generation module 3 obtains, according to the target tag code and the target time code, the first standard signal corresponding to the basic quantum logic gate in the target quantum program as the signal to be processed; and processes the signal to be processed to generate the quantum bit control signal.

In detail, since the main control module 2 stores the first tag code and the first address code that are in a one-to-one correspondence, when the main control module 2 receives the target tag code and the target time code again, the control module 2 may, with the help of the tag codes (the target tag code and the first tag code), quickly find the first address code corresponding to the target time code, call the first standard signal stored at the position of the first address code as the signal to be processed, and then process the signal to be processed to obtain the quantum bit control signal.

In the whole process, according to the distribution of quantum bits in the quantum chip to be measured, the set of quantum logic gates is set, and the first tag code and the first standard signal in a one-to-one correspondence with each of the basic quantum logic gates in the set of quantum logic gates are set. The first tag code and the first standard signal are stored in the main control module 2 for later use. When setting the set of quantum logic gates, it is necessary to ensure that the basic quantum logic gates in the set of quantum logic gates may realize any quantum program through combinations, that is, in essence, the basic quantum logic gates in the set of quantum logic gates may realize any complex quantum logic gate through combinations, which provides a reference and basis for later calls. For the target tag code and the target time code sent by the master computer and representing the basic quantum logic gate in the target quantum program, the signal processing device quickly finds the first address code corresponding to the target time code with the help of the tag codes (the target tag code and the first tag code), calls the first standard signal stored at the position of the first address code as the signal to be processed, and then processes the signal to be processed to obtain the quantum bit control signal. Consequently, it makes full use of the storage capacity of the master device 1, and requirements on the storage capacity of the set signal processing device are greatly reduced. In addition, with the preset set of basic quantum logic gates (i.e., the set of quantum logic gates) that may perform an arbitrary quantum program by combinations, any target quantum program may be performed accurately, quantum bit control signals required by the multi-bit quantum bit test may be provided, and requirements of the multi-bit quantum bit test may be satisfied.

Embodiment 4

Figure 3:
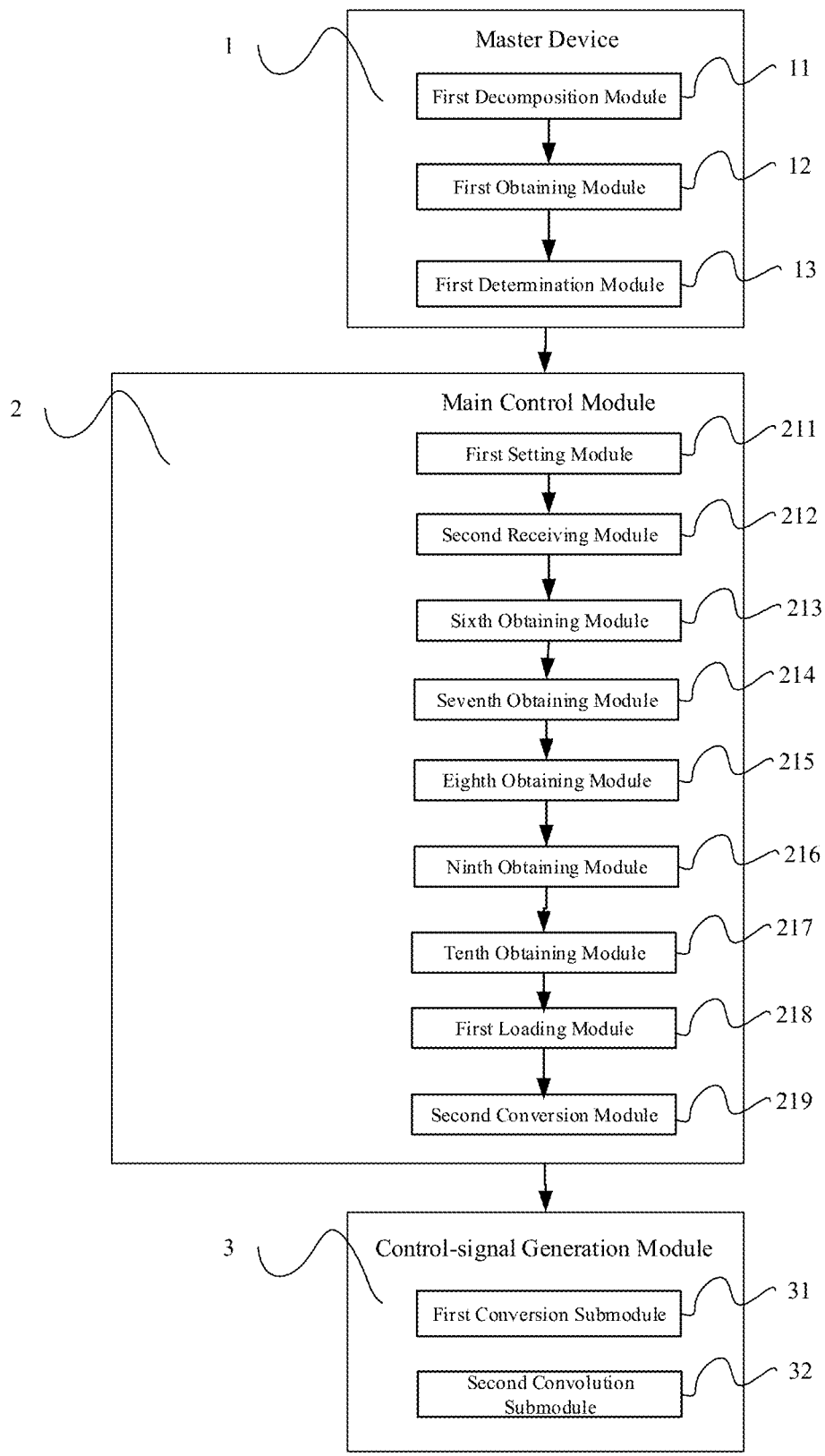
FIG. 3 is a block diagram of a hardware structure of a system for generating a quantum bit control signal according to embodiment 4 of the present disclosure.

Referring to FIG. 3, with regard to the convolutional correction processing on the signal to be processed, this embodiment differs from embodiment 3 in that this embodiment optimizes the main control module 2 for performing the convolutional correction processing on the signal to be processed.

In detail, the main control module 2 further includes a first creation module 209 and a first convolution module 210. After storing the first standard signal and obtaining the first address code corresponding to the first tag code, the method for generating the quantum bit control signal further includes that the first creation module 209 creates the convolver code corresponding to the first address code, in which the convolver code is corresponding to the first convolver module 210. The first convolution module 210 is configured to perform the convolutional correction processing on the first standard signal.

That is, the first creation module 209 and the first convolution module 210 are created inside the main control module 2, and the convolver code created by the first creation module 209 corresponds to the first convolution module 210. The number of the convolver codes and the first convolution modules 210 is consistent with the number of the first standard signals stored. The first convolution module 210 is a module that embeds a convolution function, and the specific form of the convolution function may be set as required. In this embodiment, when the convolutional processing is performed on discrete digital signals to be processed, the order of the convolution function determines the time of the convolutional processing.

After the convolver code and the first convolution module 210 are set, the main control module 2 obtains, according to the target tag code and the target time code, the first standard signal corresponding to the basic quantum logic gate in the target quantum program as the signal to be processed, and processes the signal to be processed to obtain the quantum bit control signal, which may include the followings.

The main control module 2 further includes: a first setting module 211, a second receiving module 212, a sixth obtaining module 213, a seventh obtaining module 214, an eighth obtaining module 215, a ninth obtaining module 216, a tenth obtaining module 217, a first loading module 218 and a second conversion module 219.

The first setting module 211 is configured to set the clock code and the clock triggering signal according to the target time code, in which the clock code and the clock triggering signal are in a one-to-one correspondence.

The second receiving module 212 is configured to receive the clock triggering signal.

The sixth obtaining module 213 is configured to obtain the clock code corresponding to the clock triggering signal.

The seventh obtaining module 214 is configured to obtain the target time code corresponding to the clock code.

The eighth obtaining module 215 is configured to obtain the target tag code corresponding to the target time code.

The ninth obtaining module 216 is configured to obtain the first address code corresponding to the target tag code, and to record the first address code as the address code to be called.

The tenth obtaining module 217 is configured to obtain the convolver code corresponding to the address code to be called, and to record the convolver code as the convolver code to be called.

The first loading module 218 is configured to load the first standard signal corresponding to the address code to be called into the convolver module corresponding to the convolver code to be called, and to perform, by the convolver module, the convolutional correction processing on the first standard signal loaded, so as to obtain the convolved signal.

The second conversion module 219 is configured to perform the digital-to-analog conversion processing on the convolved signal to generate the quantum bit control signal.

The above modules realize the process of generating corresponding quantum bit control signals according to the execution sequence of the quantum logic gates in the target quantum program. In this process, the convolver module is controlled by the clock triggering signal, which corresponds to the execution timing sequence of the basic quantum logic gates in the target quantum program, so that the effectiveness of implementing the quantum bit control signal is improved.

In specific implementation, in order to avoid the time delay in processing of different convolution processing modules and digital-to-analog conversion modules, the compensation for the clock code may be performed in advance according to the order of the convolution function in the convolution processing module, so as to correct the time difference in operating the signal generated by the digital-to-analog conversion modules. For example, when the maximum order of the convolution functions in all convolution processing modules is 10, it takes 10 clock cycles to perform convolutional corrections in the convolution processing modules, so the clock-code compensation value of the convolution processing modules is set to 10–N, where N is the order of the convolution function in the convolution processing modules. In this manner, instead of processing the corresponding first standard signal at the time of the clock code, the convolution processing module will process the corresponding first standard signal at the time of: clock code+10–N.

Further, the control-module generation module 3 further includes a second convolution submodule 32 configured to perform the convolutional correction processing on the signal to be processed.

It should be noted that when the master computer executes the translation of the quantum computing application, it is possible that different computing procedures (operations of the quantum logic gate) may be performed on different quantum bits simultaneously. In other words, there may be the case where the first tag codes of different first standard signals correspond to the same first time code. However, given that there are multiple parallel convolution processing modules in the FPGA, each first standard signal corresponds to only one convolution processing module, and two identical first standard signals cannot exist at the same time, the method of converting the first tag code in the set of quantum logic gates of the master computer into the combination of the first tag code, the first address code and the first convolver code in the instruction demodulation module, and of sending the first tag code, the first address code and the first convolver code, respectively, into the parallel convolution processing modules for processing and computing will not cause conflicts. At the same time, by providing the corrections to the quantum bit control signals, the convolution processing may effectively reduce the system error rate of the quantum chip in performing the quantum computing applications.

The constructions, features and functions of the present disclosure are described in detail in the embodiments with reference to the accompanying drawings. The above embodiments are only preferred embodiments of the present disclosure, and the present disclosure is not limited by the accompanying drawings. All equivalent embodiments modified or changed according to the concept of the present disclosure and do not depart from the spirit of the description and the drawings should fall within the protection scope of the present disclosure.

What is claimed is:

1. A method for generating a quantum bit control signal, comprising:
    receiving a first tag code and a first standard signal corresponding to each basic quantum logic gate in a set of reference quantum gates from a master computer, wherein the set of reference quantum gates comprises a plurality of basic quantum logic gates, the basic quantum logic gate comprises a single-quantum logic gate and/or a double-quantum logic gate, the first tag code is configured to identify the basic quantum logic gate, the each basic quantum logic gate has the fixed first tag code, and the first standard signal is a signal that performs an operation of the basic quantum logic gate;
    storing the first standard signal, and obtaining a first address code identifying a storage location of the first standard signal, wherein the first address code and the first tag code are in a one-to-one correspondence;
    receiving a target tag code and a target time code corresponding to each basic quantum logic gate in a target quantum program from the master computer, wherein the target tag code is the first tag code corresponding to the basic quantum logic gate in the target quantum program, and the target time code is configured to identify an execution timing sequence of the basic quantum logic gate in the target quantum program;
    obtaining, according to the target tag code and the target time code, the first standard signal corresponding to the basic quantum logic gate in the target quantum program as a signal to be processed; and
    processing the signal to be processed to generate the quantum bit control signal.

2. The method for generating a quantum bit control signal according to claim 1, wherein receiving the target tag code and the target time code corresponding to the each basic quantum logic gate in the target quantum program from the master computer comprises:
    decomposing the target quantum program to generate a combination of basic quantum logic gates;
    obtaining the first tag code corresponding to the each basic quantum logic gate in the target quantum program, and recording the first tag code as the target tag code; and determining the target time code corresponding to the each basic quantum logic gate according to the execution timing sequence of the each basic quantum logic gate in the target quantum program.

3. The method for generating a quantum bit control signal according to claim 1, wherein obtaining, according to the target tag code and the target time code, the first standard signal corresponding to the basic quantum logic gate in the target quantum program as the signal to be processed comprises:
    setting a clock code and a clock triggering signal according to the target time code, in which the clock code and the clock triggering signal are in a one-to-one correspondence;
    receiving the clock triggering signal;
    obtaining the clock code corresponding to the clock triggering signal;
    obtaining the target time code corresponding to the clock code;
    obtaining the target tag code corresponding to the target time code;
    obtaining the first address code corresponding to the target tag code; and
    obtaining the first standard signal stored corresponding to the first address code as the signal to be processed.

4. The method for generating a quantum bit control signal according to claim 3, wherein setting the clock code and the clock triggering signal according to the target time code comprises:
    determining the clock code according to the time code and a clock cycle, in which the clock code is equal to a ratio of the time code to the clock cycle, and the clock cycle is a clock cycle of a processing device; and
    forming the clock triggering signal according to the clock code.

5. The method for generating a quantum bit control signal according to claim 3, wherein processing the signal to be processed to obtain the quantum bit control signal comprises:
    performing a digital-to-analog conversion on the signal to be processed to obtain an analog quantum bit control signal.

6. The method for generating a quantum bit control signal according to claim 5, before performing the digital-to-analog conversion on the signal to be processed to obtain the analog quantum bit control signal, further comprising:
    performing convolutional correction processing on the signal to be processed.

7. The method for generating a quantum bit control signal according to claim 1, after storing the first standard signal and obtaining the first address code corresponding to the first tag code, further comprising:

creating a convolver code corresponding to the first address code, wherein the convolver code is corresponding to a preset convolver module, the preset convolver module is configured to perform convolutional correction processing on the first standard signal.

8. The method for generating a quantum bit control signal according to claim 7, wherein obtaining, according to the target tag code and the target time code, the first standard signal corresponding to the basic quantum logic gate in the target quantum program as the signal to be processed, and processing the signal to be processed to obtain the quantum bit control signal comprises:
setting a clock code and a clock triggering signal according to the target time code, in which the clock code and the clock triggering signal are in a one-to-one correspondence;
receiving the clock triggering signal;
obtaining the clock code corresponding to the clock triggering signal;
obtaining the target time code corresponding to the clock code;
obtaining the target tag code corresponding to the target time code;
obtaining the first address code corresponding to the target tag code, and recording the first address code as an address code to be called;
obtaining the convolver code corresponding to the address code to be called, and recording the convolver code as a convolver code to be called;
loading the first standard signal corresponding to the address code to be called into the convolver module corresponding to the convolver code to be called, and performing, by the convolver module, the convolutional correction processing on the first standard signal loaded, so as to obtain a convolved signal; and
performing digital-to-analog conversion processing on the convolved signal to generate the quantum bit control signal.

9. The method for generating a quantum bit control signal according to claim 8, wherein performing, by the convolver module, the convolutional correction processing on the first standard signal loaded, so as to obtain the convolved signal comprises:
performing, by the convolver module, the convolutional correction processing on the first standard signal through a convolution function embedded, so as to obtain a signal with eliminating distortion.

10. The method for generating a quantum bit control signal according to claim 9, before performing, by the convolver module, the convolutional processing on the first standard signal loaded, so as to obtain the signal with eliminating distortion, further comprising:
adjusting the clock code corresponding to the convolver module according to an order of the convolution function.

11. A system for generating a quantum bit control signal, comprising a master computer and a signal computing device, wherein,
the master computer comprises one or more first processors and a first non-transitory memory, the one or more first processors are configured to read instructions from the first non-transitory memory: to obtain and to store a set of quantum logic gates and a target quantum program, to send a first tag code and a first standard signal corresponding to each basic quantum logic gate in the set of quantum logic gates to the main control module, and to send a target tag code and a target time code corresponding to each basic quantum logic gate in the target quantum program to the main control module, in which the set of quantum logic gates refers to a set including a plurality of quantum logic gates of quantum programs, the each basic quantum logic gate is corresponding to the unique first tag code, and the first standard signal is a signal for performing an operation of the basic quantum logic gate, the target tag code is the first tag code corresponding to the basic quantum logic gate in the target quantum program, and the target time code is configured to identify an execution timing sequence of the basic quantum logic gate in the target quantum program;
the signal computing device comprises one or more second processors and a second non-transitory memory, the one or more second processors are configured to execute one or more software modules stored in the second non-transitory memory, the one or more software modules stored in the second non-transitory memory comprises:
a main control module is configured to receive and to store the first tag code and the first standard signal, to set a first address code in a one-to-one correspondence with each first standard signal, to receive the target tag code and the target time code, and to generate a signal to be processed in combination with the first address code, the target tag code and the target time code; and
a control-signal generation module is configured to receive and to process the signal to be processed, so as to generate the quantum bit control signal.

12. The system for generating a quantum bit control signal according to claim 11, wherein the one or more first processors are configured to execute one or more software modules stored in the first non-transitory memory, the one or more software modules stored in the first non-transitory memory comprises a first decomposition module, a first obtaining module and a first determination module, wherein,
the first decomposition module is configured to decompose the target quantum program to generate a combination of basic quantum logic gates;
the first obtaining module is configured to obtain the first tag code corresponding to the each basic quantum logic gate in the target quantum program, and to record the first tag code as the target tag code; and
the first determination module is configured to determine the target time code corresponding to the each basic quantum logic gate according to the execution timing sequence of the each basic quantum logic gate in the target quantum program.

13. The system for generating a quantum bit control signal according to claim 11, wherein the main control module comprises:
a second determination module, configured to determine a clock code according to the time code and a clock cycle, in which the clock code is equal to a ratio of the time code to the clock cycle, and the clock cycle is a clock cycle of a processing device;
a first processing module, configured to form a clock triggering signal according to the clock code;
a first receiving module, configured to receive the clock triggering signal;
a second obtaining module, configured to obtain the clock code corresponding to the clock triggering signal;
a third obtaining module, configured to obtain the target time code corresponding to the clock code;
a fourth obtaining module, configured to obtain the target tag code corresponding to the target time code;

a fifth obtaining module, configured to obtain the first address code corresponding to the target tag code; and a second processing module, configured to obtain the first standard signal stored corresponding to the first address code as the signal to be processed.

14. The system for generating a quantum bit control signal according to claim 11, wherein the main control module comprises a first creation module and a first convolution module, in which, the first creation module is configured to create a convolver code corresponding to the first address code, wherein the convolver code is corresponding to a preset convolver module; and the first convolution module is configured to perform convolutional correction processing on the first standard signal.

15. The system for generating a quantum bit control signal according to claim 14, wherein the main control module further comprises:

a first setting module, configured to set a clock code and a clock triggering signal according to the target time code, in which the clock code and the clock triggering signal are in a one-to-one correspondence;

a second receiving module, configured to receive the clock triggering signal;

a sixth obtaining module, configured to obtain the clock code corresponding to the clock triggering signal;

a seventh obtaining module, configured to obtain the target time code corresponding to the clock code;

an eighth obtaining module, configured to obtain the target tag code corresponding to the target time code;

a ninth obtaining module, configured to obtain the first address code corresponding to the target tag code, and to record the first address code as an address code to be called;

a tenth obtaining module, configured to obtain the convolver code corresponding to the address code to be called, and to record the convolver code as a convolver code to be called;

a first loading module, configured to load the first standard signal corresponding to the address code to be called into the convolver module corresponding to the convolver code to be called, and to perform, by the convolver module, the convolutional correction processing on the first standard signal loaded, so as to obtain a convolved signal; and a second conversion module, configured to perform digital-to-analog conversion processing on the convolved signal to generate the quantum bit control signal.

16. The system for generating a quantum bit control signal according to claim 11, wherein the control-signal generation module comprises:

a first conversion submodule, configured to perform a digital-to-analog conversion on the signal to be processed, so as to generate an analog quantum bit control signal.

17. The system for generating a quantum bit control signal according to claim 16, wherein the control-signal generation module further comprises:

a second convolution submodule, configured to perform convolutional correction processing on the signal to be processed.

* * * * *